(12) United States Patent
Sabhapathy et al.

(10) Patent No.: US 6,616,059 B2
(45) Date of Patent: Sep. 9, 2003

(54) HYBRID VEHICLE POWERTRAIN THERMAL MANAGEMENT SYSTEM AND METHOD FOR CABIN HEATING AND ENGINE WARM UP

(75) Inventors: Peri Sabhapathy, Northville, MI (US); Zheng Lou, Plymouth, MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 0 days.

(21) Appl. No.: 10/036,056

(22) Filed: Jan. 4, 2002

(65) Prior Publication Data

US 2003/0127528 A1 Jul. 10, 2003

(51) Int. Cl.[7] .................................................. B60H 1/02
(52) U.S. Cl. .......................... 237/12.3 B; 123/142.5 E; 180/65.2
(58) Field of Search ...................... 237/12.3 B, 12.3 R; 123/142.5 E; 180/65.2, 69.6, 69.4

(56) References Cited

U.S. PATENT DOCUMENTS

| | | | |
|---|---|---|---|
| 4,391,407 A | 7/1983 | Nakazawa | |
| 4,605,164 A | 8/1986 | Hayashi et al. | |
| 4,932,365 A | 6/1990 | Marschall et al. | |
| 5,433,282 A | 7/1995 | Moroto et al. | |
| 5,531,285 A | 7/1996 | Green | |
| 5,537,956 A | * 7/1996 | Rennfeld et al. | 123/41.29 |
| 5,678,760 A | * 10/1997 | Muso et al. | 237/2 A |
| 5,839,656 A | * 11/1998 | Yamano et al. | 237/12.3 B |
| 5,971,290 A | 10/1999 | Echigoya et al. | |
| 5,979,257 A | 11/1999 | Lawrie | |
| 6,016,774 A | * 1/2000 | Bokkers et al. | 123/41.1 |
| 6,040,561 A | 3/2000 | Murty | |
| 6,124,644 A | * 9/2000 | Olson et al. | 290/1 B |
| 6,178,928 B1 | * 1/2001 | Corriveau | 123/41.12 |
| 6,178,929 B1 | 1/2001 | Schatz | |
| 6,213,233 B1 | 4/2001 | Sonntag et al. | |
| 6,237,357 B1 | 5/2001 | Hirao et al. | |
| 6,253,866 B1 | 7/2001 | Kojima | |
| 6,450,275 B1 | * 9/2002 | Gabriel et al. | 180/65.4 |
| 6,467,286 B2 | * 10/2002 | Hasebe et al. | 62/185 |

* cited by examiner

Primary Examiner—Derek Boles
(74) Attorney, Agent, or Firm—Scott M. Confer

(57) ABSTRACT

A powertrain thermal management system for a hybrid vehicle having provisions for passenger cabin heating and engine warm up.

20 Claims, 9 Drawing Sheets

HYBRID VEHICLE POWERTRAIN THERMAL MANAGEMENT SYSTEM AND METHOD FOR CABIN HEATING AND ENGINE WARM UP

FIELD OF THE INVENTION

The invention relates to a thermal management system for a vehicle and more particularly to a powertrain thermal management system for a hybrid vehicle with provisions for passenger cabin heating and engine warm up.

BACKGROUND OF THE INVENTION

A vehicle cabin heating system must be able to maintain passenger comfort at all times during operation of the vehicle, including extreme cold weather conditions. The heating system must not only be able to increase the vehicle cabin air temperature to the passenger comfort level within a reasonable amount of time of vehicle start, but also maintain the vehicle cabin temperature at the passenger comfort level.

Typically, an internal combustion engine in a conventional vehicle releases sufficient heat to adequately heat the vehicle cabin at all vehicle engine loads. The conventional vehicle uses waste heat from the engine coolant for cabin heating. However, the internal combustion engine in a hybrid electric vehicle is usually smaller than the engine in a comparably sized conventional vehicle. Also, the internal combustion engine in the hybrid electric vehicle may not be operating when the vehicle is being powered by the electric motor. Moreover, while the internal combustion engine is operating, it operates at near peak efficiency and rejects less heat to the coolant. As a -result, the heating system may not be able to provide sufficient heat continuously to the vehicle cabin to maintain passenger comfort. Additionally, upon cold start, the internal combustion engine in the hybrid electric vehicle typically takes longer to reach its optimum operating temperature than the internal combustion engine of the conventional vehicle.

It would be desirable to produce a powertrain thermal management system for a hybrid electric vehicle which provides heat to the vehicle cabin and minimizes engine warm up time.

SUMMARY OF THE INVENTION

Consistent and consonant with the present invention, a powertrain thermal management system for a hybrid electric vehicle which provides heat to the vehicle cabin and minimizes engine warm up time has surprisingly been discovered. The powertrain thermal management system for a hybrid vehicle comprises: a first cooling circuit having a first pump for circulating a coolant therein for removal of heat from a first heat source; a second cooling circuit having a second pump for circulating a coolant therein for removal of heat from a second heat source, the second heat source including at least one of an electric motor, a transmission heat exchanger, and an electronics water jacket or cold plate; a heater core for providing heat to a passenger cabin of the hybrid vehicle; and valve means in fluid communication with the first cooling circuit and the second cooling circuit, the valve means selectively routing coolant from at least one of the first cooling circuit and the second cooling circuit to the heater core.

BRIEF DESCRIPTION OF THE DRAWINGS

The above, as well as other objects, features, and advantages of the present invention will be understood from the detailed description of the preferred embodiments of the present invention with reference to the accompanying drawings, in which.

DETAILED DESCRIPTION OF THE PREFERRED EMBODIMENTS

Figure 1:
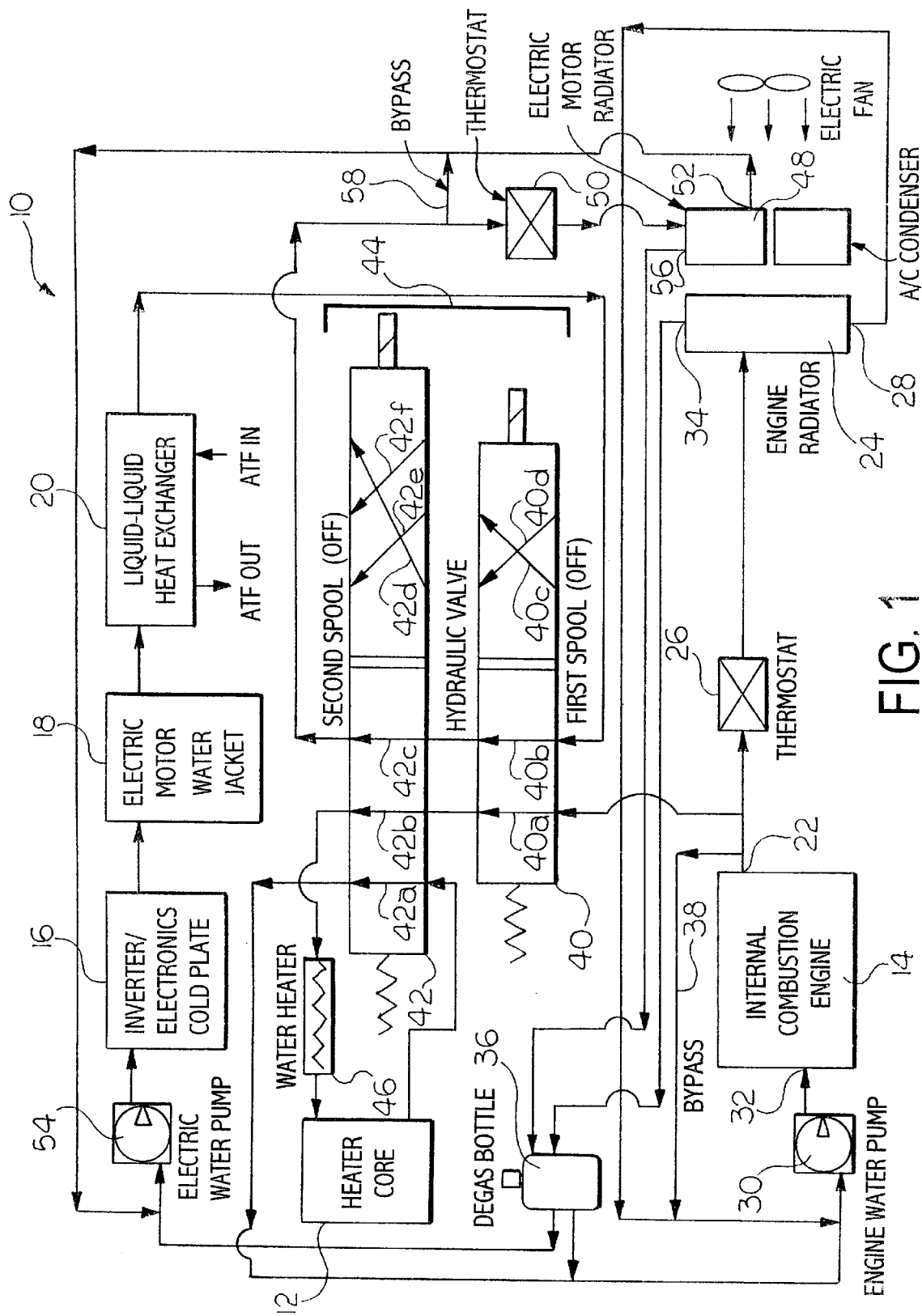
FIG. 1 is a schematic view of a powertrain thermal management system for a hybrid electric vehicle incorporating the features of the invention, wherein the hydraulic valve is positioned to cause heating of the vehicle cabin with the vehicle internal combustion engine coolant.

Referring now to the drawings, and particularly FIG. 1, there is shown generally at 10 a powertrain thermal management system for a hybrid electric vehicle incorporating the features of the invention. The thermal management system 10 includes two cooling circuits which are used to supply heat to a heater core 12 for a passenger cabin (not shown) and an internal combustion engine 14 as needed. The first cooling circuit removes heat from coolant for the internal combustion engine 14. The second cooling circuit removes heat from the coolant for a cold plate 16 for vehicle electronics (not shown), an electric motor water jacket 18, and a transmission fluid heat exchanger 20. The vehicle electronics may include for example a DC/AC inverter or a DC/DC converter. In the embodiments to be described, the coolant circuits use a coolant mixture of 50 percent ethylene glycol and 50 percent water. It is understood that other ethylene glycol and water percentages and other coolant mixtures can be used.

In the first circuit, an engine coolant outlet 22 of the internal combustion engine 14 is in fluid communication with an engine radiator 24. An engine coolant thermostat 26 is interposed between the internal combustion engine 14 and the engine radiator 24. A primary engine radiator outlet 28 is in fluid communication with an engine water pump 30. Either a mechanically driven or an electrically driven water pump 30 can be used. The engine water pump 30 is in fluid communication with an engine coolant inlet 32 of the internal combustion engine 14. A secondary engine radiator outlet 34 is in fluid communication with a degas bottle 36. The degas bottle 36 is in fluid communication with the engine water pump 30 and removes air from the coolant in the circuit. In the embodiment shown, an engine bypass conduit 38 provides fluid communication between the outlet 22 and the engine water pump 30. The bypass conduit 38 can be removed and the thermal management system 10 will remain operable.

Figure 4:
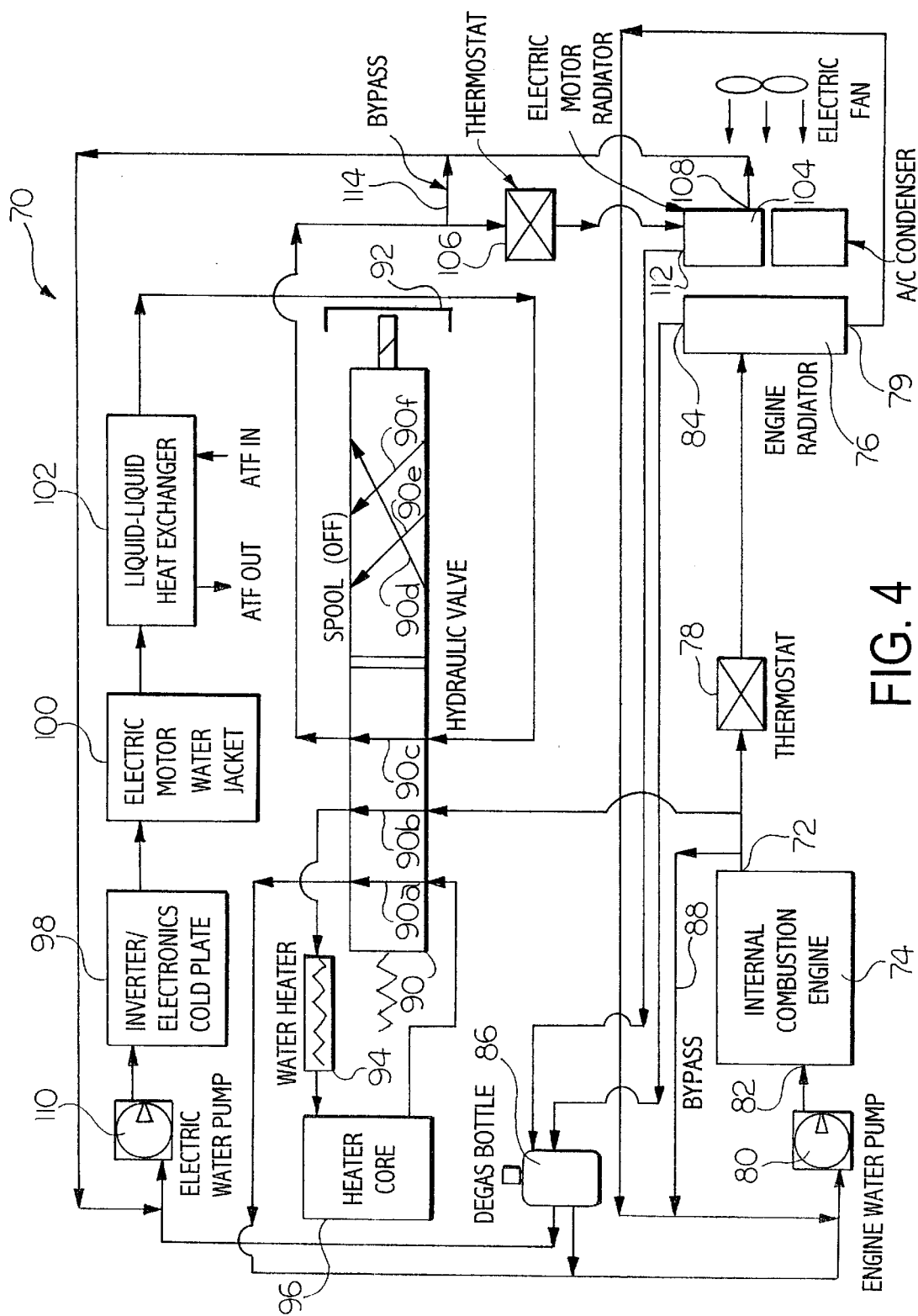
FIG. 4 is a schematic view of an alternate embodiment of the powertrain thermal management system for a hybrid electric vehicle illustrated in FIGS. 1–3, wherein a hydraulic valve having a single spool is used and the hydraulic valve is positioned to cause heating of the vehicle cabin with the vehicle internal combustion engine coolant.
Figure 5:
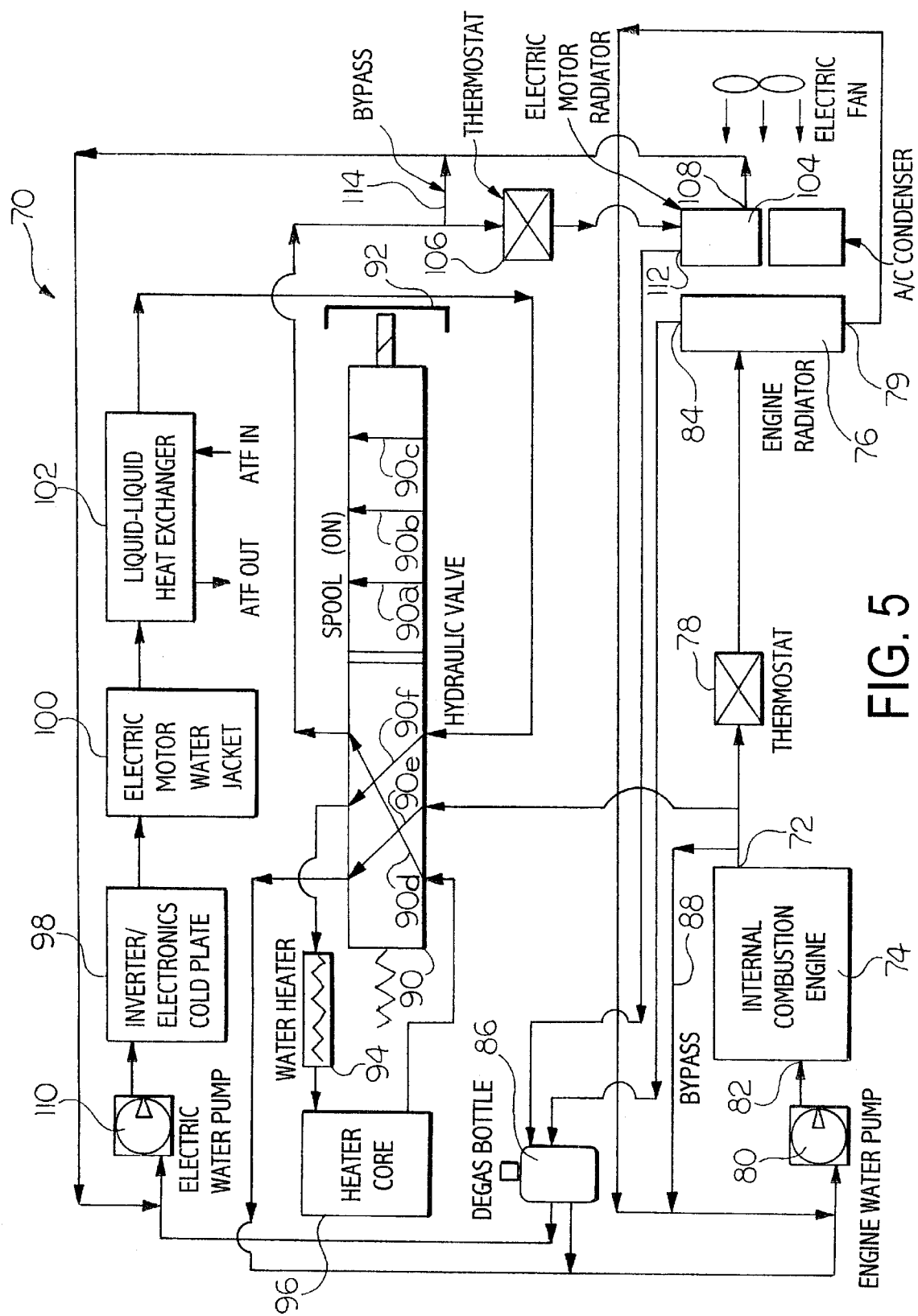
FIG. 5 is a schematic view of the powertrain thermal management system for a hybrid electric vehicle illustrated in FIG. 4, wherein the hydraulic valve is positioned to cause heating of the vehicle cabin with the vehicle electric motor coolant.
Figure 6:
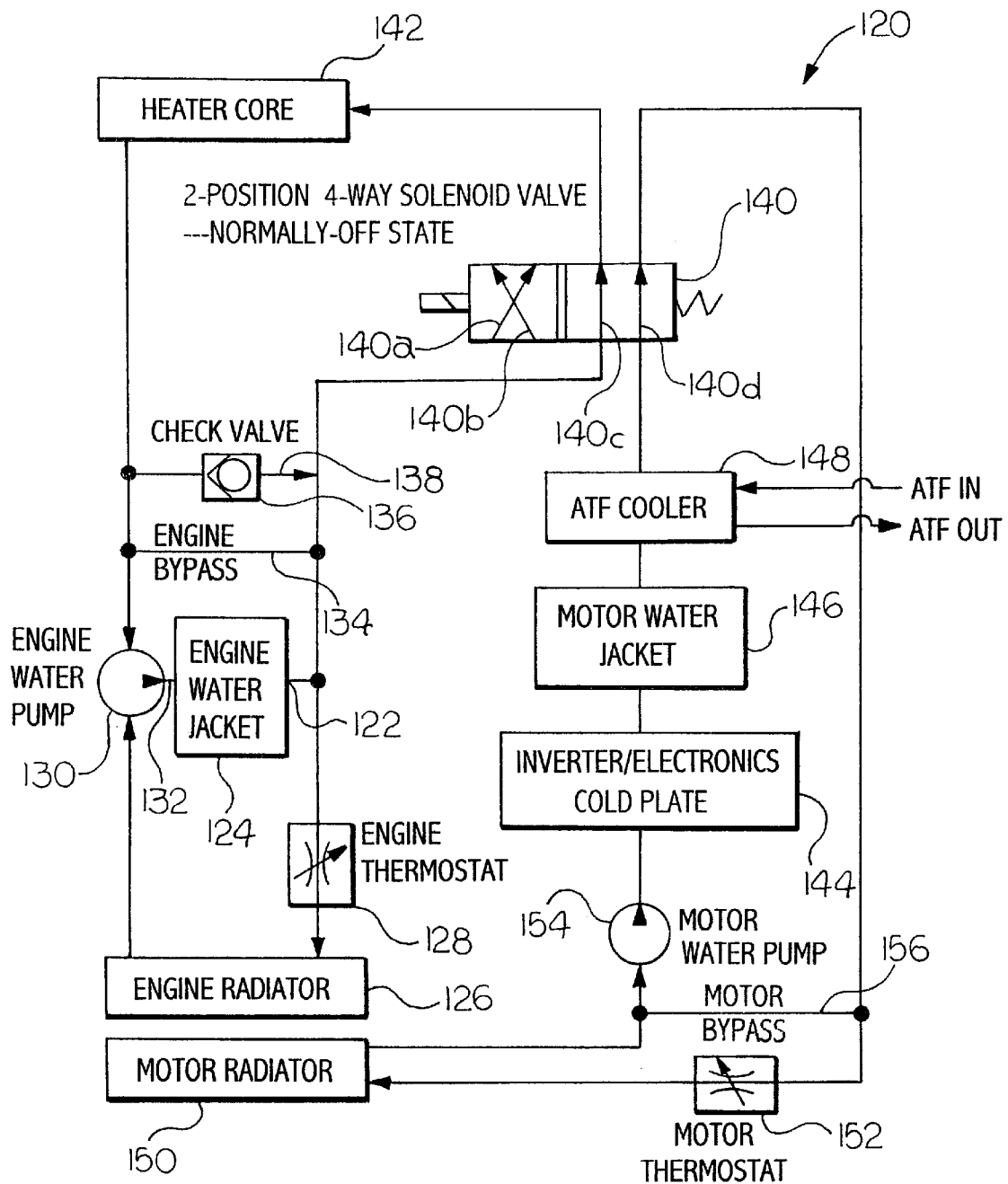
FIG. 6 is a schematic view of an alternate embodiment of the powertrain thermal management system for a hybrid electric vehicle illustrated in FIGS. 1–3, wherein a 2-position 4-way solenoid valve is used in place of the hydraulic valve and the valve is positioned to cause heating of the vehicle cabin with the vehicle internal combustion engine coolant.
Figure 7:
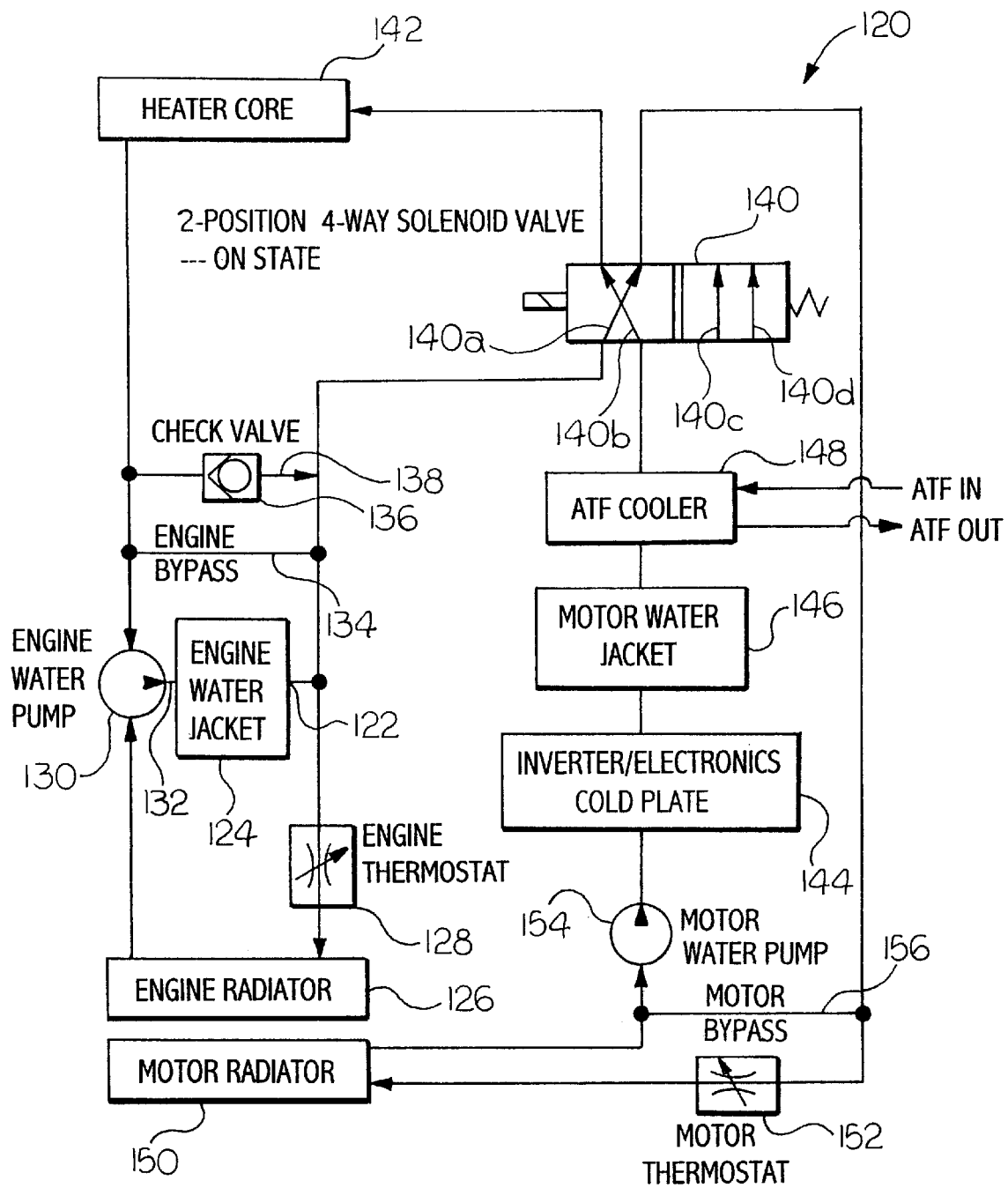
FIG. 7 is a schematic view of the powertrain thermal management system for a hybrid electric vehicle illustrated in FIG. 6, wherein the valve is positioned to cause heating of the vehicle cabin with the vehicle electric motor coolant.
Figure 8:
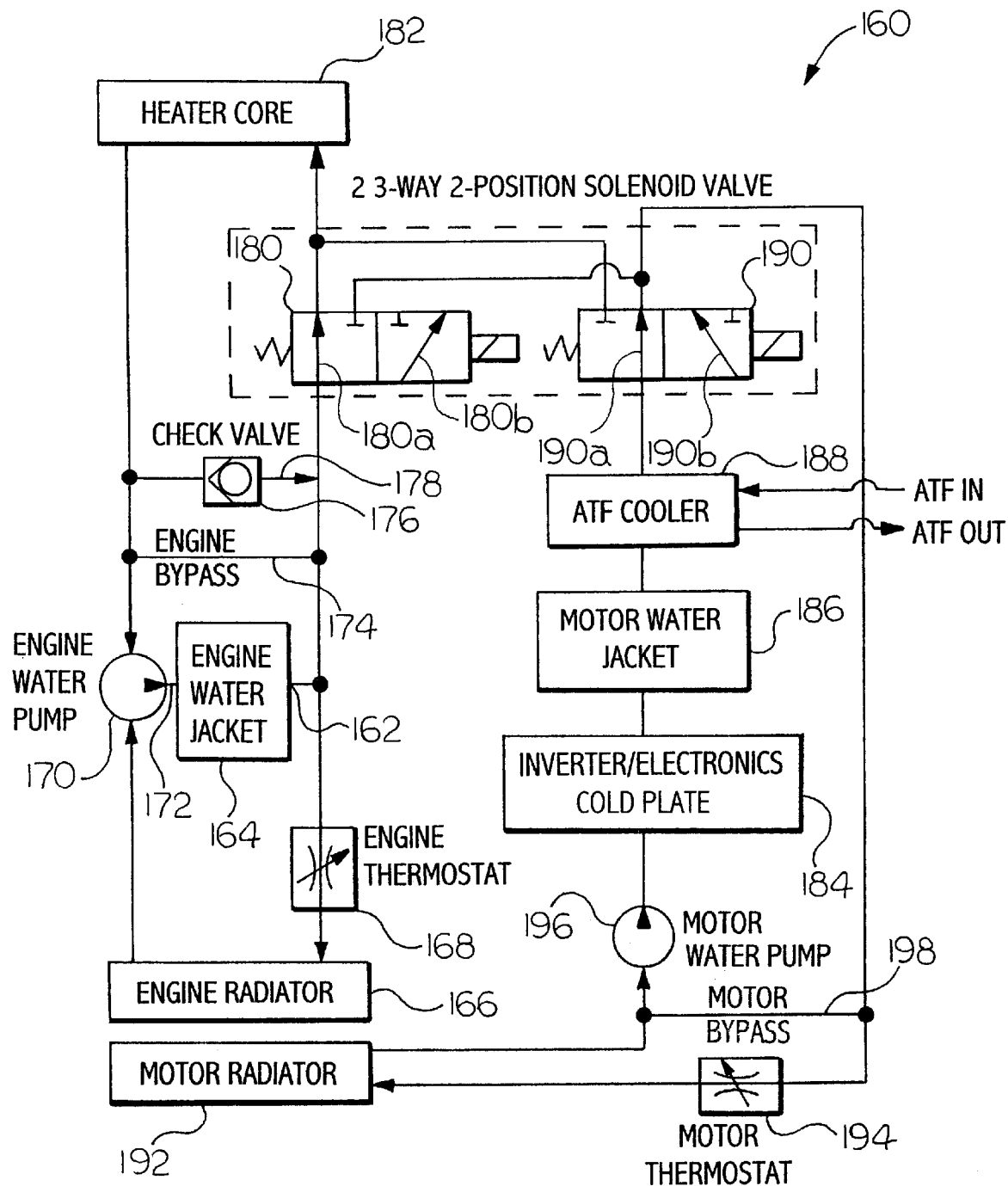
FIG. 8 is a schematic view of an alternate embodiment of the powertrain thermal management system for a hybrid electric vehicle illustrated in FIGS. 1–3, wherein two 2-position 3-way solenoid valves are used in place of the hydraulic valve and the valves are positioned to cause heating of the vehicle cabin with the vehicle internal combustion engine coolant.
Figure 9:
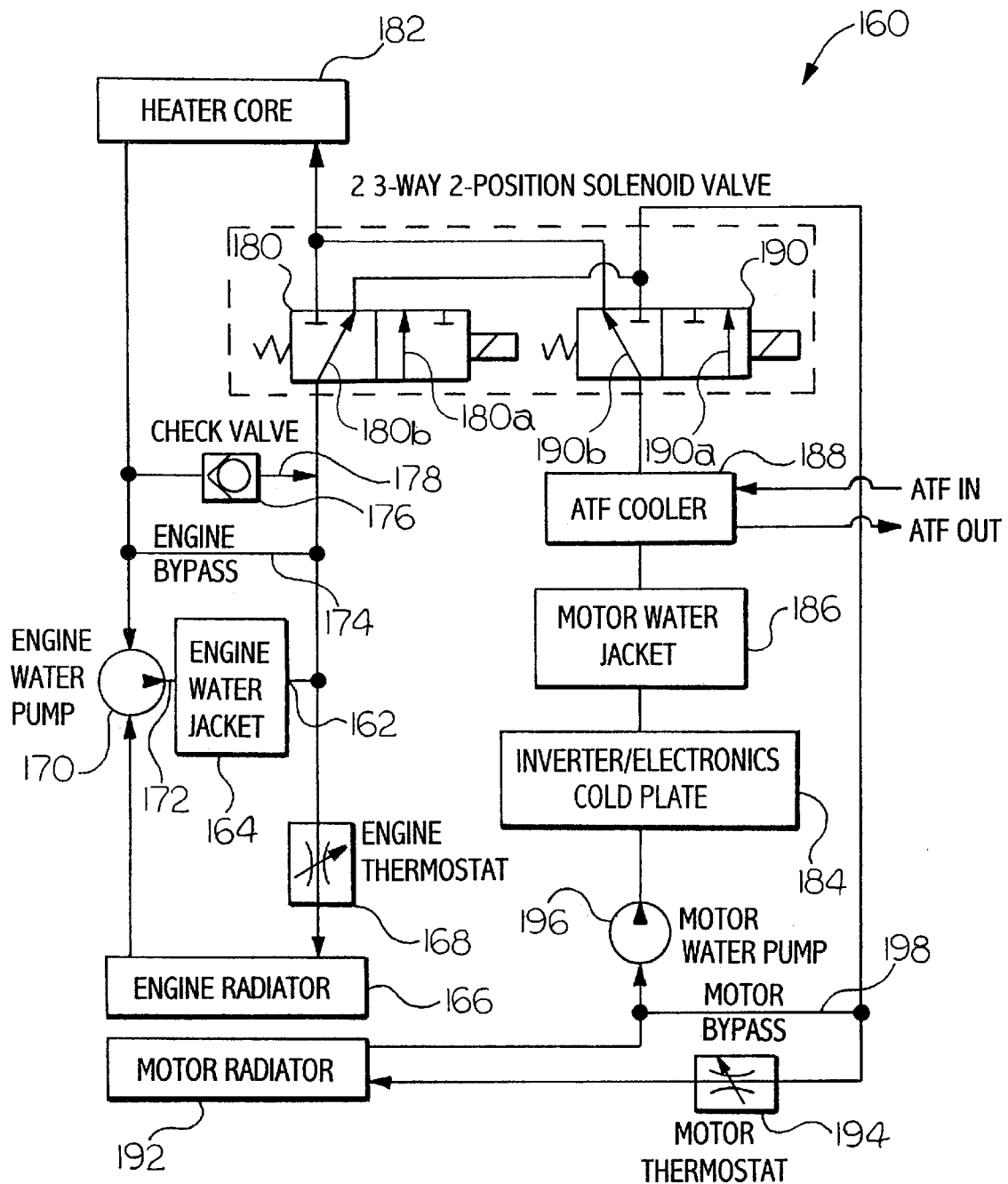
FIG. 9 is a schematic view of the powertrain thermal management system for a hybrid electric vehicle illustrated in FIG. 8, wherein the valves are positioned to cause heating of the vehicle cabin with the vehicle electric motor coolant.

The outlet 22 of the internal combustion engine 14 is in fluid communication with a passage 40a of a first spool 40 and a passage 42b of a second spool 42 of a hydraulic valve 44. Any conventional hydraulic valve 44 may be used such as, for example, a solenoid or vacuum actuated linear or rotary type. The hydraulic valve 44 illustrated in FIG. 1 is a 6-way 2-position valve. Alternatively, the first spool 40 can be eliminated from the thermal management system 10 as illustrated in FIGS. 4 and 5, a 4-way 2-position hydraulic valve can be used as illustrated in FIGS. 6 and 7, or two 3-way 2-position solenoid valves can be used as illustrated in FIGS. 8 and 9. The first spool 40 and the second spool 42 are shown in the off position in FIG. 1.

In the embodiment shown, the passage 42b of the second spool 42 is in fluid communication with a water heater 46. The water heater 46 is in fluid communication with the heater core 12. The water heater 46 can be eliminated if desired and the second spool 42 can be in direct fluid communication with the heater core 12. The heater core 12 is in fluid communication with the passage 42a of the second spool 42 of the hydraulic valve 44. The passage 42a is in fluid communication with the engine water pump 30.

In the second circuit, the cold plate 16, the electric motor water jacket 18, and the heat exchanger 20 are in fluid communication. As illustrated, the cold plate 16, the electric motor water jacket 18, and the heat exchanger 20 are connected in series. It is understood that the order of connection and arrangement of the cold plate 16, the electric motor water jacket 18, and the heat exchanger 20 could be changed without departing from the spirit and scope of the invention. The heat exchanger 20 is in fluid communication with a passage 40b of the first spool 40. The passage 40b is in fluid communication with a passage 42c of the second spool 42. The passage 42c of the second spool 42 is in fluid communication with an electric motor radiator 48. A motor coolant thermostat 50 is interposed between and is in fluid communication with the passage 42c of the second spool 42 and the electric motor radiator 48. A primary electric motor radiator outlet 52 is in fluid communication with an electric water pump 54. The electric water pump 54 is in fluid communication with the cold plate 16. A secondary electric motor radiator outlet 56 is in fluid communication with the degas bottle 36. The degas bottle 36 is in fluid communication with the electric water pump 54. In the embodiment shown, an electric motor coolant bypass conduit 58 provides fluid communication between the passage 42c of the second spool 42 and the electric water pump 54.

Figure 2:
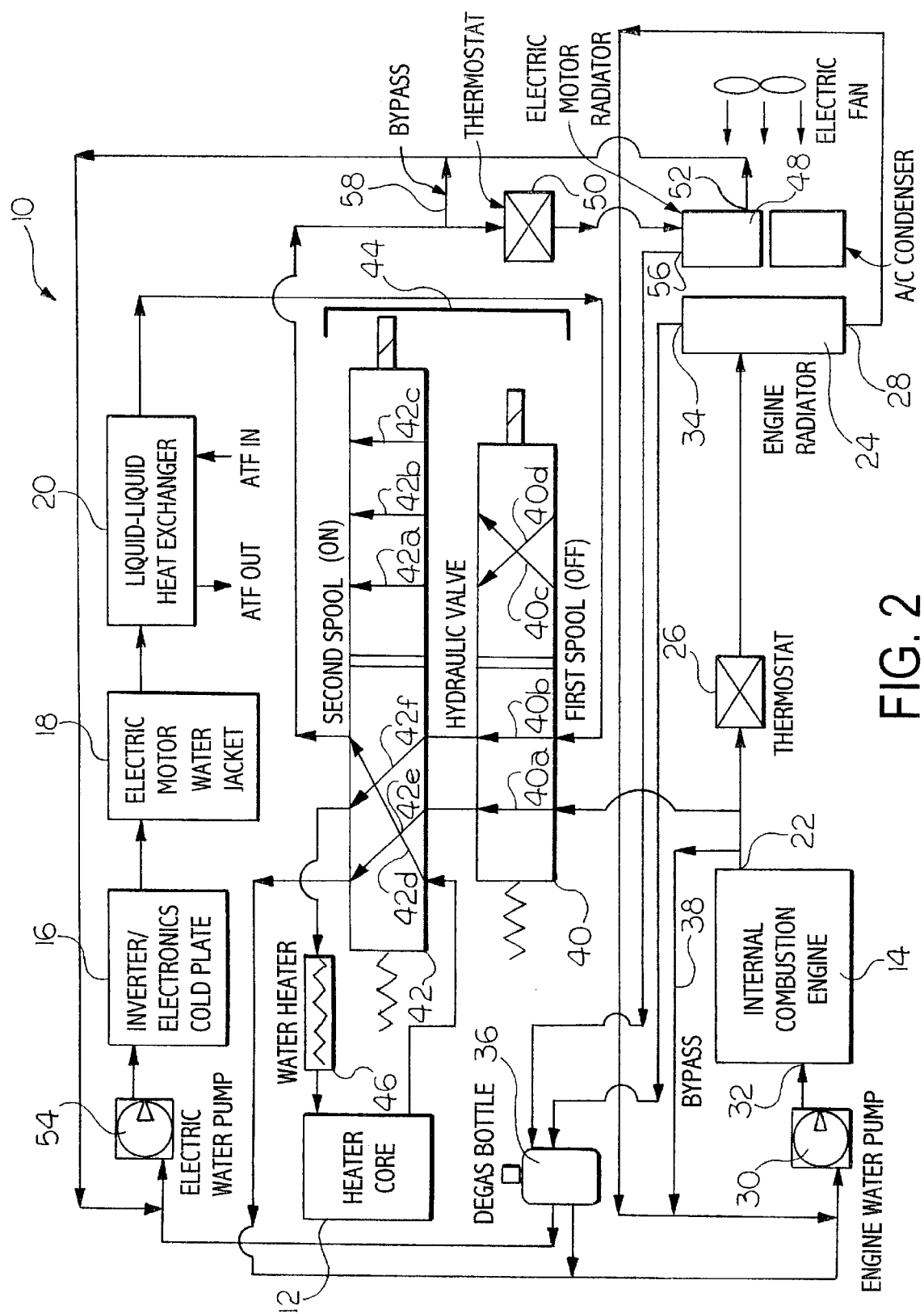
FIG. 2 is a schematic view of the powertrain thermal management system for a hybrid electric vehicle illustrated in FIG. 1, wherein the hydraulic valve is positioned to cause heating of the vehicle cabin with the vehicle electric motor coolant.

FIG. 2 illustrates the thermal management system 10 illustrated in FIG. 1 with the first spool 40 shown in the off position and the second spool 42 shown in the on position. The outlet 22 of the internal combustion engine 14 is in fluid communication with the passage 40a of the first spool 40 and a passage 42e of the second spool 42. The passage 42e is in fluid communication with the engine water pump 30, thereby bypassing the water heater 46 and the heater core 12. The engine water pump 30 is in fluid communication with the inlet 32 of the internal combustion engine 14. The remainder of the first circuit is unchanged from FIG. 1.

The heat exchanger 20 of the second circuit is in fluid communication with the passage 40b of the first spool 40. The passage 40b is in fluid communication with a passage 42f of the second spool 42. The passage 42f is in fluid communication with the water heater 46 which is in fluid communication with the heater core 12. The heater core 12 is in fluid communication with a passage 42d of the second spool 42. The passage 42d is in fluid communication with the thermostat 50, the electric motor radiator 48, and the electric water pump 54 in series. The electric water pump 54 is in fluid communication with the cold plate 16, the electric motor water jacket 18, and the heat exchanger 20 in series. The remainder of the second circuit is unchanged from FIG. 1.

Figure 3:
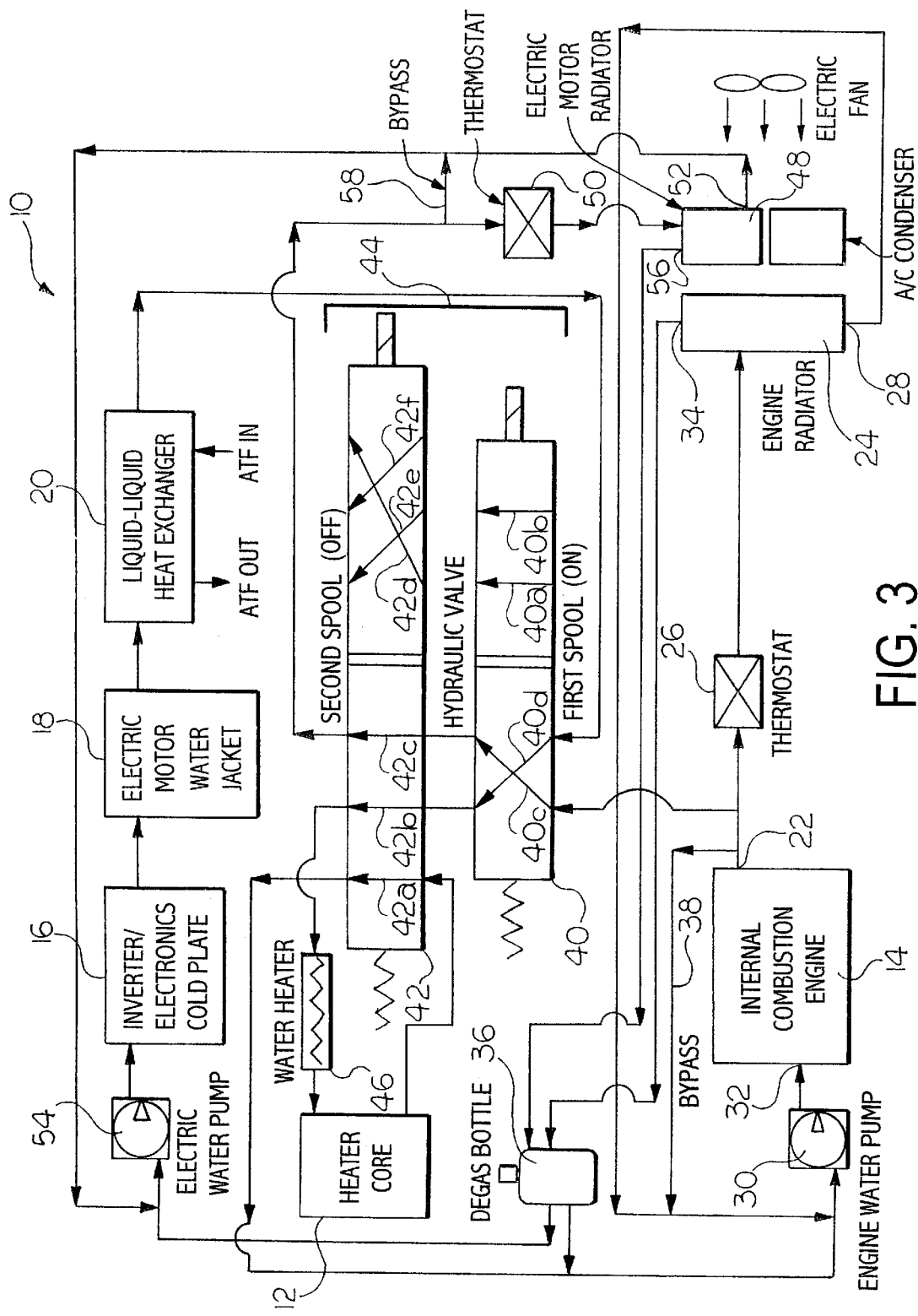
FIG. 3 is a schematic view of the powertrain thermal management system for a hybrid electric vehicle illustrated in FIG. 1, wherein the hydraulic valve is positioned to cause heating of the vehicle internal combustion engine with the vehicle electric motor coolant.

FIG. 3 illustrates the thermal management system 10 illustrated in FIG. 1 with the first spool 40 shown in the on position and the second spool 42 shown in the off position. The outlet 22 of the internal combustion engine 14 is in fluid communication with a passage 40c of the first spool 40 and the passage 42c of the second spool 42. The passage 42c is in fluid communication with the thermostat 50, the electric motor radiator 48, the electric water pump 54, the cold plate 16, the electric motor water jacket 18, and the heat exchanger 20 in series. The heat exchanger 20 is in fluid communication with a passage 40d of the first spool 40 and the passage 42b of the second spool 42. The passage 42b is in fluid communication with the water heater 46, the heater core 12, the passage 42a, the engine water pump 30 and the inlet 32 of the internal combustion engine 14 in series. The remainder of the thermal management system 10 is unchanged from FIG. 1.

FIGS. 4 and 5 illustrate a second embodiment of the invention, a thermal management system 70 where the first spool 40 of the hydraulic valve 44 of the thermal management system 10 shown in FIGS. 1–3 has been eliminated. In the thermal management system 70, an engine coolant outlet 72 of an internal combustion engine 74 is in fluid communication with an engine radiator 76 with a thermostat 78 interposed therebetween. A primary engine radiator outlet 79 is in fluid communication with an engine water pump 80 which is in fluid communication with an engine coolant inlet 82 of the internal combustion engine 74. Either a mechanically driven or electrically driven water pump 80 can be used. A secondary engine radiator outlet 84 is in fluid communication with a degas bottle 86. The degas bottle 86 is in fluid communication with the engine water pump 80 and removes air from the coolant in the circuit. In the embodiment shown, an engine bypass conduit 88 provides fluid communication between the outlet 72 and the engine water pump 80. The bypass conduit 88 can be removed and the thermal management system 70 will remain operable.

The outlet 72 of the internal combustion engine 74 is in fluid communication with a passage 90b of a spool 90 of a hydraulic valve 92. Any conventional hydraulic valve 92 may be used such as, for example, a solenoid or vacuum actuated linear or rotary type. The spool 90 is shown in the off position in FIG. 4. In the embodiment shown, the passage 90b of the spool 90 is in fluid communication with a water heater 94. The water heater 94 is in fluid communication with a heater core 96. The water heater 94 can be eliminated and the spool 90 can be in direct fluid communication with the heater core 96. The heater core 96 is in fluid communication with the passage 90a of the spool 90. The passage 90a is in fluid communication with the engine water pump 80.

A cold plate 98 for vehicle electronics (not shown), an electric motor water jacket 100, and a transmission fluid heat exchanger 102 are in fluid communication. As illustrated, the cold plate 98, the electric motor water jacket 100, and the heat exchanger 102 are connected in series. It is understood that the order of connection and arrangement of the cold plate 98, the electric motor water jacket 100, and the heat exchanger 102 could be changed without departing from the spirit and scope of the invention. The heat exchanger 102 is in fluid communication with a passage 90c of the spool 90. The passage 90c is in fluid communication with an electric motor radiator 104 with a motor coolant thermostat 106 interposed therebetween. A primary electric motor radiator outlet 108 is in fluid communication with an electric water pump 110. The electric water pump 110 is in fluid communication with the cold plate 98. A secondary electric motor radiator outlet 112 is in fluid communication with the degas bottle 86. The degas bottle 86 is in fluid communication with the electric water pump 110. In the embodiment shown, an electric motor coolant bypass conduit 114 provides fluid communication between the passage 90c of the spool 90 and the electric water pump 110.

As illustrated in FIG. 5, when the spool 90 is in the on position, the outlet 72 of the internal combustion engine 74 is in fluid communication with the passage 90e of the spool 90. The passage 90e is in fluid communication with the engine water pump 80, thereby bypassing the water heater 94 and the heater core 96. The engine water pump 80 is in fluid communication with the inlet 82 of the internal combustion engine 74.

The heat exchanger 102 is in fluid communication with the passage 90f of the spool 90. The passage 90f is in fluid communication with the water heater 94 which is in fluid communication with the heater core 96. The heater core 96 is in fluid communication with a passage 90d of the spool 90. The passage 90d is in fluid communication with the thermostat 106, the electric motor radiator 104, and the electric water pump 110 in series. The electric water pump 110 is in fluid communication with the cold plate 98, the electric motor water jacket 100, and the heat exchanger 102 in series. The remainder of the circuit is unchanged from FIG. 4.

A third embodiment of the present invention is shown in FIGS. 6 and 7. In a thermal management system 120, an engine coolant outlet 122 of an internal combustion engine water jacket 124 is in fluid communication with an engine radiator 126 with a thermostat 128 interposed therebetween. The engine radiator 126 is in fluid communication with an engine water pump 130 which is in fluid communication with an engine coolant inlet 132 of the internal combustion engine water jacket 124. In the embodiment shown, an engine bypass conduit 134 provides fluid communication between the outlet 122 and the engine water pump 130. The bypass conduit 134 can be removed and the thermal management system 120 will remain operable. A check valve 136 is provided in a check valve conduit 138 between the engine water pump 130 and the outlet 122. The check valve 136 and the check valve conduit 138 can be removed and the thermal management system 120 will remain operable.

The outlet 122 of the internal combustion engine water jacket 124 is in fluid communication with a passage 140c of a solenoid valve 140. The solenoid valve 140 shown is a 2-position 4-way type and is shown in the off position in FIG. 6. The passage 140c is in fluid communication with a heater core 142. The heater core 142 is in fluid communication with the engine water pump 130.

A water jacket or cold plate 144 for vehicle electronics (not shown), an electric motor water jacket 146, and a transmission fluid heat exchanger 148 are in fluid communication. As illustrated, the cold plate 144, the electric motor water jacket 146, and the heat exchanger 148 are connected in series. It is understood that the order of connection and arrangement of the cold plate 144, the electric motor water jacket 146, and the heat exchanger 148 could be changed without departing from the spirit and scope of the invention. The heat exchanger 148 is in fluid communication with a passage 140d of the solenoid valve 140. The passage 140d is in fluid communication with an electric motor radiator 150 with a motor coolant thermostat 152 interposed therebetween. The electric motor radiator 150 is in fluid communication with an electric water pump 154. The electric water pump 154 is in fluid communication with the cold plate 144. An electric motor coolant bypass conduit 156 provides fluid communication between the passage 140d of the solenoid valve 140 and the electric water pump 154.

FIG. 7 illustrates the thermal management system 120 illustrated in FIG. 6 with the solenoid valve 140 shown in the on position. The outlet 122 of the internal combustion engine water jacket 124 is in fluid communication with a passage 140a of the solenoid valve 140. The passage 140a is in fluid communication with the thermostat 152 which is in fluid communication with the electric motor radiator 150. Fluid communication is provided between the electric motor radiator 150 and the electric water pump 154. The electric water pump 154 is in fluid communication with the cold plate 144. The cold plate 144, the electric motor water jacket 146, and the heat exchanger 148 are connected in series.

The heat exchanger 148 is in fluid communication with a passage 140b of the solenoid valve 140. Fluid communication is provided between the passage 140b and the heater core 142. The heater core 142 is in fluid communication with the engine water pump 130 which is in fluid communication with the inlet 132 of the internal combustion engine water jacket 124.

A fourth embodiment of the present invention is shown in FIGS. 8 and 9. In a thermal management system 160, an engine coolant outlet 162 of an internal combustion engine water jacket 164 is in fluid communication with an engine radiator 166 with a thermostat 168 interposed therebetween. The engine radiator 166 is in fluid communication with an engine water pump 170 which is in fluid communication with an engine coolant inlet 172 of the internal combustion engine water jacket 164. In the embodiment shown, an engine bypass conduit 174 provides fluid communication between the engine water pump 170 and the outlet 162. The bypass conduit 174 can be removed and the thermal management system 160 will remain operable. A check valve 176 is provided in a check valve conduit 178 between the outlet 162 and the engine water pump 170. The check valve 176 and the check valve conduit 178 can be removed and the thermal management system 160 will remain operable.

The outlet 162 of the internal combustion engine water jacket 164 is in fluid communication with a passage 180a of a first solenoid valve 180. In FIG. 8, the first solenoid valve 180 shown is a 2-position 3-way type and is shown in the off position. The passage 180a is in fluid communication with a heater core 182. The heater core 182 is in fluid communication with the engine water pump 170.

A water jacket or cold plate 184 for vehicle electronics (not shown), an electric motor water jacket 186, and a transmission fluid heat exchanger 188 are in fluid communication. As illustrated, the cold plate 184, the electric motor water jacket 186, and the heat exchanger 188 are connected in series. It is understood that the order of connection and arrangement of the cold plate 184, the electric motor water jacket 186, and the heat exchanger 188 could be changed without departing from the spirit and scope of the invention. The heat exchanger 188 is in fluid communication with a passage 190a of a second solenoid valve 190. In FIG. 8, the second solenoid valve 190 shown is a 2-position 3-way type and is shown in the off position. The passage 190a is in fluid communication with an electric motor radiator 192 with a motor coolant thermostat 194 interposed therebetween. The electric motor radiator 192 is in fluid communication with an electric water pump 196. The electric water pump 196 is in fluid communication with the cold plate 184. An electric motor coolant bypass conduit 198 provides fluid communication between the passage 190a of the second solenoid valve 190 and the electric water pump 196.

As illustrated in FIG. 9, when the first solenoid valve 180 and the second solenoid valve 190 are in the on position, the outlet 162 of the internal combustion engine water jacket 164 is in fluid communication with a passage 180b of the first solenoid valve 180. The passage 180b is in fluid communication with the thermostat 194, the motor radiator 192, the motor water pump 196, the cold plate 184, the electric motor water jacket 186, and the transmission fluid heat exchanger 188 in series. The transmission heat exchanger 188 is in fluid communication with a passage 190b of the second solenoid valve 190. The passage 190b is in fluid communication with the heater core 182. The heater core 182 is in fluid communication with the engine water pump 170. The remainder of the circuit is unchanged from FIG. 8.

The operation of the embodiments of the invention will now be described. The internal combustion engine cooling circuit of FIGS. 1–3 facilitates maintaining the internal combustion engine 14 at its optimum operating temperature. The coolant, circulated by the water pump 30, removes the waste heat from the engine 14 and carries the waste heat to the engine radiator 24 where the excess heat is rejected to the ambient air. The thermostat 26 controls the coolant flow through the engine radiator 24 and the bypass conduit 38. The coolant flowing out of the engine coolant outlet 22 returns to the engine water pump 30 through one or more of three possible flow paths, illustrated in FIGS. 1–3. The coolant can return to the engine water pump 30 through the bypass conduit 38, the hydraulic valve 44, or the engine radiator 24.

During warm up of the internal combustion engine 14, the thermostat 26 is closed and the coolant flows only through the bypass conduit 38 and the hydraulic valve 44. Depending on the position of the first spool 40 and the second spool 42, the engine coolant entering the hydraulic valve 44 returns to the engine water pump 30 either after flowing through the heater core 12 (illustrated in FIG. 1) or bypassing the heater core 12 (illustrated in FIG. 2).

The electric motor cooling circuit helps maintain the vehicle electronics, the electric motor 18, and the transmission at their optimum operating temperatures. The coolant, circulated by an electric water pump 54, carries the waste heat from the vehicle electronics, the electric motor 18, and the transmission to the electric motor radiator 48 where the excess heat is rejected to the ambient air. The transmission heat exchanger 20 is a liquid to liquid type which transfers the heat from the transmission fluid to the motor coolant.

Depending upon the positions of the first spool 40 and the second spool 42, the motor coolant entering the hydraulic valve 44 can take three possible flow routes. The coolant either bypasses the heater core 12 (illustrated in FIG. 1), flows through the heater core 12 and through the remainder of the electric motor cooling circuit (illustrated in FIG. 2), or flows through the heater core 12 and the internal combustion engine cooling circuit before returning to the electric motor cooling circuit (illustrated in FIG. 3). The thermostat 50 and the bypass conduit 58 facilitate control of the coolant flow through the electric motor radiator 48.

The hydraulic valve 44 helps provide heat to a vehicle cabin (not shown) either from the engine cooling circuit (illustrated in FIG. 1) or from the motor cooling circuit (illustrated in FIG. 2). The following table lists the coolant flow paths in the thermal management system 10 for the different spool positions.

| First Spool | Second Spool | Cooling Circuit Characteristics |
|---|---|---|
| Off | Off | Heater Core is connected to engine cooling circuit. |
| | | Motor coolant bypasses the heater core. |
| On | Off | Heater Core is connected to motor cooling circuit. |
| | | Engine coolant bypasses the heater core. |
| Off | On | Both circuits are connected through the hydraulic valve. |
| | | Motor coolant is used to warm up the engine. |
| On | On | Both circuits are connected through the hydraulic valve. |
| | | Motor coolant is used to warm up the engine. |

A vehicle thermal control module (not shown) sends a signal for actuation of the hydraulic valve 44. Two sensors (not shown), one in the engine cooling circuit and the other in the motor cooling circuit read the respective coolant temperatures and a signal is transmitted to the control module. When the coolant in the engine cooling circuit is hotter than the coolant in the motor cooling circuit, the hydraulic valve 44 is actuated to connect the heater core 12 to the engine cooling circuit (illustrated in FIG. 1). The hot engine coolant thus provides heat to the heater core 12 and the coolant from the motor cooling circuit bypasses the heater core 12.

When the coolant in the motor coolant circuit is hotter than the coolant in the engine coolant circuit, the hydraulic valve 44 is actuated to connect the heater core 12 to the motor cooling circuit (illustrated in FIG. 2). The hot motor coolant thus provides heat to the heater core 12 and the coolant from the engine cooling circuit bypasses the heater core 12.

When the internal combustion engine 14 is cold and the coolant in the motor cooling circuit is hot, the hydraulic valve 44 is actuated to connect the motor cooling circuit to the engine cooling circuit (illustrated in FIG. 3). Thus, the waste heat from the motor cooling circuit is used to warm up the internal combustion engine 14. If the internal combustion engine 14 warm up configuration is not desired, only a single spool is required in the hydraulic valve as illustrated in FIGS. 4 and 5.

In the embodiment illustrated in FIGS. 6 and 7, a 4-way 2-position solenoid valve 140, as opposed to a 6-way, 2-position valve is used to control the flow between the engine cooling circuit and the motor cooling circuit. When the solenoid valve 140 is in the off position as shown in FIG. 6, the engine cooling circuit and motor cooling circuit are maintained as independent circuits. The motor water pump 154 pumps the motor coolant through the cold plate 144, the electric motor water jacket 146, the heat exchanger 148, the solenoid valve 140, and either the bypass conduit 156 or the thermostat 152 and the motor radiator 150 and back to the motor water pump 154. The engine water pump 130 pumps the engine coolant through the engine water jacket 124 and back to the engine water pump 130 through a parallel combination of the bypass conduit 134, the heater core 142, and the thermostat 128 and engine radiator 126.

When the coolant is cold in the engine cooling circuit and there is a need for engine and/or passenger cabin warm up, the solenoid valve 140 can be switched to the on position resulting in a crossover connection as illustrated in FIG. 7. The warm coolant from the cold plate 144, electric motor water jacket 146, and heat exchanger 148 flows through the solenoid valve 140; the heater core 142; a parallel combination of the check valve 136, the bypass conduit 134, and the engine water jacket 124; the solenoid valve 140; a parallel combination of the bypass conduit 156 and the thermostat 152 and the motor radiator 150. The coolant does not pass through the engine radiator 126 because it is restricted by the thermostat 128 due to the low engine coolant temperature.

The first solenoid valve 180 and the second solenoid valve 190 shown in FIGS. 8 and 9 can replace the solenoid valve 140 shown in FIGS. 6 and 7 to achieve an equivalent thermal management system 160.

From the foregoing description, one ordinarily skilled in the art can easily ascertain the essential characteristics of this invention and, without departing from the spirit and scope thereof, can make various changes and modifications to the invention to adapt it to various usages and conditions.

What is claimed is:

1. A powertrain thermal management system for a hybrid vehicle comprising:
    a first cooling circuit having a first pump for circulating a coolant therein for removal of heat from a first heat source, said first heat source including at least one of an electric motor, a transmission heat exchanger, and an electronics cold plate;
    a second cooling circuit having a second pump for circulating a coolant therein for removal of heat from a second heat source;
    a heater core for providing heat to a passenger cabin of the hybrid vehicle; and
    valve means in fluid communication with said first cooling circuit, said second cooling circuit, and said heater core, said valve means selectively routing coolant from at least one of said first cooling circuit and said second cooling circuit to said heater core.

2. The system according to claim 1, wherein the second heat source is an internal combustion engine.

3. The system according to claim 2, wherein said valve means selectively routes coolant from said first cooling circuit to said second cooling circuit to aid in warm up of the internal combustion engine.

4. The system according to claim 1 wherein said valve means is a dual spool 6-way 2-position hydraulic valve.

5. The system according to claim 1 wherein said valve means is a single spool 6-way 2-position hydraulic valve.

6. The system according to claim 1 wherein said valve means is a 4-way 2-position hydraulic valve.

7. The system according to claim 1 wherein said valve means includes at least one 3-way 2-position solenoid valve.

8. The system according to claim 1 including a degas bottle fluidly connected to at least one of said first cooling circuit and said second cooling circuit for removing air from the at least one of said first cooling circuit and said second cooling circuit.

9. The system according to claim 1 including a heater in fluid communication with said valve means and said heater core.

10. A hybrid electric vehicle comprising:
    an internal combustion engine for selectively imparting motion to the vehicle;
    an electric motor for selectively imparting motion to the vehicle; and
    a powertrain thermal management system further comprising:
        a first cooling circuit having a first pump for circulating a coolant therein for removal of heat from a first heat source, said first heat source including at least one of the electric motor, a transmission heat exchanger, and an electronics cold plate;
        a second cooling circuit having a second pump for circulating a coolant therein for removal of heat from a second heat source, the second heating source including at least the internal combustion engine;
        a heater core for providing heat to a passenger cabin of the electric hybrid vehicle; and
        valve means in fluid communication with said first cooling circuit, said second cooling circuit, and said heater core, said valve means selectively routing coolant from at least one of said first cooling circuit and said second cooling circuit to said heater core.

11. The vehicle according to claim 10, wherein said valve means selectively routes coolant from said first cooling circuit to said second cooling circuit to aid in warm up of the internal combustion engine.

12. The vehicle according to claim 10 wherein said valve means is a dual spool 6-way 2-position hydraulic valve.

13. The vehicle according to claim 10 wherein said valve means is a single spool 6-way 2-position hydraulic valve.

14. The vehicle according to claim 10 wherein said valve means is a 4-way 2-position hydraulic valve.

15. The vehicle according to claim 10 wherein said valve means includes at least one 3-way 2-position solenoid valve.

16. The vehicle according to claim 10 including a degas bottle fluidly connected to at least one of said first cooling circuit and said second cooling circuit for removing air from the at least one of said first cooling circuit and said second cooling circuit.

17. The vehicle according to claim 10 including a heater in fluid communication with said valve means and said heater core.

18. A method of heating a passenger cabin with a powertrain thermal management system in a hybrid vehicle comprising the steps of:
    providing a first cooling circuit having a first pump for circulating a coolant therein for removal of heat from a first heat source, the first heat source including at least one of an electric motor, a transmission heat exchanger, and an electronics cold plate;

providing a second cooling circuit having a second pump for circulating a coolant therein for removal of heat from a second heat source;

providing a heater core for supplying heat to a passenger cabin of the hybrid vehicle; and selectively routing coolant from at least one of the first cooling circuit and the second cooling circuit to the heater core;

removing the heat from the coolant routed to the heater core from the at least one of the first cooling circuit and the second cooling circuit in the heating core and supplying the heat to at least one of an internal combustion engine and the passenger cabin of the hybrid vehicle.

19. The method of claim 18 including the step of heating the coolant routed from the at least one of the first cooling circuit and the second cooling circuit with a water heater prior to removing the heat from the coolant in the heating core.

20. The method of claim 18 including the step of heating the second cooling circuit with the heat removed from the first heat source in the first cooling circuit.

* * * * *